(12) United States Patent
Wells et al.

(10) Patent No.: US 11,754,257 B1
(45) Date of Patent: Sep. 12, 2023

(54) SIDEWAYS REFLECTOR FOR RADIATION EMITTING DIODE ASSEMBLY

(71) Applicant: CoreLED Systems, LLC, Livonia, MI (US)

(72) Inventors: Brian C. Wells, Grosse Pointe Farms, MI (US); Derek Mallory, Northville, MI (US); Nadia Zelikovskaya, Plymouth, MI (US); John Kahl, Troy, MI (US)

(73) Assignee: CoreLED Systems, LLC, Livonia, MI (US)

( * ) Notice: Subject to any disclaimer, the term of this patent is extended or adjusted under 35 U.S.C. 154(b) by 0 days.

(21) Appl. No.: 17/843,432

(22) Filed: Jun. 17, 2022

(51) Int. Cl.
| | |
|---|---|
| *F21V 7/04* | (2006.01) |
| *F21V 19/00* | (2006.01) |
| *F21V 7/24* | (2018.01) |
| *F21V 17/06* | (2006.01) |
| *F21Y 115/10* | (2016.01) |

(52) U.S. Cl.
CPC .......... *F21V 7/04* (2013.01); *F21V 7/24* (2018.02); *F21V 17/06* (2013.01); *F21V 19/0015* (2013.01); *F21Y 2115/10* (2016.08)

(58) Field of Classification Search
None
See application file for complete search history.

(56) References Cited

U.S. PATENT DOCUMENTS

| | | | | |
|---|---|---|---|---|
| 5,568,680 A | * | 10/1996 | Parker | B21D 53/883 428/596 |
| 8,277,086 B2 | * | 10/2012 | Heitmann | F21V 7/24 362/322 |
| 2002/0159259 A1 | * | 10/2002 | Sara | F21V 7/10 362/346 |
| 2004/0042214 A1 | * | 3/2004 | Webb | F21V 11/02 362/341 |
| 2008/0128725 A1 | * | 6/2008 | Hsing Chen | G02B 19/0071 257/E33.059 |
| 2011/0090705 A1 | * | 4/2011 | Hackfort | F21V 7/10 362/347 |
| 2012/0014107 A1 | * | 1/2012 | Avila | F21V 29/777 362/294 |
| 2014/0233245 A1 | * | 8/2014 | Kerpe | H05K 1/0209 362/296.04 |

FOREIGN PATENT DOCUMENTS

WO  WO-2005119795 A1 * 12/2005  ......... H01L 25/167

\* cited by examiner

*Primary Examiner* — Christopher E Dunay
(74) *Attorney, Agent, or Firm* — Gunther Evanina; Butzel Long

(57) ABSTRACT

A surface mountable reflector for use with a surface-emitting diode (e.g., LED) includes at least one side wall, a roof, and a mounting pad extending from at least one side wall to facilitate mounting of the surface mountable reflector to a circuit substrate, with the roof of the surface mountable reflector disposed over a diode mounted on the circuit substrate, whereby simulation of an edge-emitting diode is achieved.

12 Claims, 4 Drawing Sheets

SIDEWAYS REFLECTOR FOR RADIATION EMITTING DIODE ASSEMBLY

FIELD OF THE DISCLOSURE

This disclosure pertains to radiation emitting diode assemblies that emit radiation in a direction parallel with a circuit substrate on which the radiation emitting diode is mounted and to a surface mountable reflector to effectively simulate edge emission from a surface emitting diode.

BACKGROUND OF THE DISCLOSURE

Edge-emitting or side-emitting LED assemblies are employed in optical communications, various instrument display panels, and video displays. Side-emitting LEDs have certain advantages over surface emitting or top-emitting diodes, including higher collimating property that allows more efficient coupling with optical waveguides, better modulation of bandwidth, more focused directional emission, and higher data rates in optical communications applications. However, side-emitting LEDs are more complex, more expensive to manufacture, and more difficult to mount. Additionally, side emitting diodes cannot achieve the output levels of top emitters due to thermal limitations. And finally, side-emitting diodes have a taller (thicker) package profile than surface emitting diodes, especially chip scale surface emitting diode packages (CSPs) that typically consist only of a semiconductor die, a phosphor layer coated on one side of the die, and contacts on another side of the die.

There is currently a need for lower cost and higher output alternatives that simulate side-emitting performance.

SUMMARY OF THE DISCLOSURE

This disclosure relates to diode assemblies that utilize a top-emitting diode (or diodes) and a surface mountable reflector, which together mimic the functionality of assemblies utilizing side-emitting diodes. The disclosed assemblies comprise a circuit substrate, a top-emitting diode mounted on the circuit substrate, and a surface mountable reflector affixed to the circuit substrate. The reflector can include at least one side wall and a reflective roof. Radiation emitted from the top and side surfaces of the diode are redirected toward an open end of the surface mountable reflector in a direction generally parallel with the major plane (i.e., mounting surface) of the circuit substrate, whereby side-emission is simulated at a lower cost and higher output as compared with an actual side-emitting diode.

In certain embodiments, the roof of the surface mount reflector can have a generally rectangularly shaped reflective roof with reflective side walls that descend from the roof, with each wall having an associated mounting pad to facilitate mounting of the surface mount reflector to a circuit substrate on which a radiation-emitting diode may be mounted below the roof of the surface mountable reflector.

This disclosure also relates to a surface mountable reflector having a unitary body including at least one side wall and a reflective roof, wherein the side wall and/or roof can redirect light toward an open end of the surface mountable reflector in a direction parallel with the mounting surface of a circuit substrate.

DETAILED DESCRIPTION

The expression "edge-emitting diode assembly" as used herein refers to an assembly in which radiation from an emitting diode is directed in a relatively narrow beam pattern, generally less than about 45° and in a direction that is approximately parallel with a circuit substrate on which the emitting diode is mounted.

The expression "surface-emitting diode" refers to a generally conventional, relatively low-cost, radiation-emitting (visible, ultraviolet, or infrared) diode that emits radiation from side and top surfaces. In contrast, edge-emitting diodes are relatively complex multilayer structures in which the active (radiation-emitting layer) is sandwiched between cladding layers that guide radiation toward edges of the layered structure.

Reflective side walls and roof refers to opaque walls and roof having surfaces facing the radiation emitting diode that are reflective. Suitable reflective surfaces include relatively smooth metal surfaces (copper, tin, brass, etc.) and metallized surfaces. Such surfaces are generally flat, but may be curved.

Figure 1:
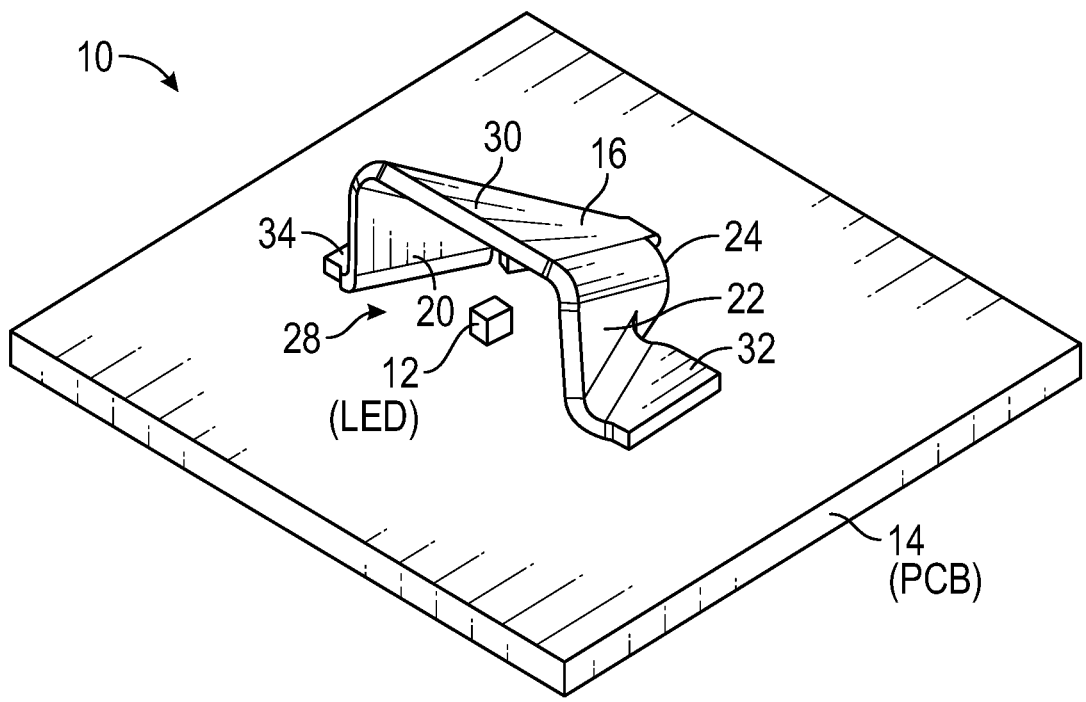
FIG. 1 is a perspective view of a first embodiment of a disclosed simulated edge-emitting assembly employing a surface-emitting diode.

Shown in FIG. 1 is an edge-emitting diode assembly 10 in accordance with this disclosure. The assembly includes a radiation emitting diode 12 solder-mounted to a circuit substrate 14, and a surface mountable reflector 16 affixed to the circuit substrate.

Figure 2:
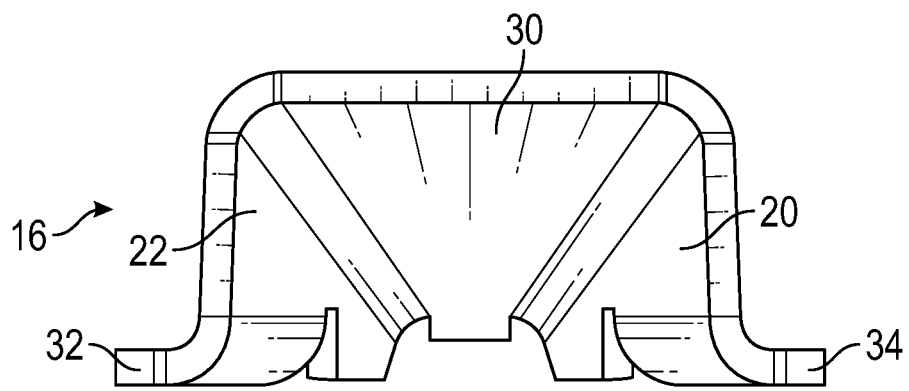
FIG. 2 is a rear view of a surface mountable reflector used in the assembly shown in FIG. 1.

In the first embodiment, the surface mountable reflector 16 has a generally semi-pyramidal shape (turned on its side when mounted on a circuit substrate). Reflector 16 includes opposite side walls 20, 22 that diverge from a generally closed end 24 toward an open (light-emitting) end 28, and a roof 30 that diverges from the closed end toward the open end. As can be understood by reference to FIG. 2, end 24 need not be completely closed. Substantial closure is sufficient to redirect (reflect) most radiation impinging on internal surfaces of walls 20, 22 and roof 30 in a direction substantially parallel to the plane of circuit substrate 14, from the generally closed end 24 toward the open end 28. Diode 12 is a relatively inexpensive surface-emitting diode.

The assembly 10 simulates characteristics of a side-emitting diode at a significantly lower cost and higher output, while providing performance suitable for many lighting applications, including instrument panel lighting (e.g., automotive instrument panels, instrument panels for consumer appliances and electronics, etc.), and possibly for video display panels and optical communications.

Reflector 16 can be provided with mounting pads 32, 34 that extend laterally outward from lower edges of side walls 20, 22 of reflector 16 to substrate 14.

Figure 3:
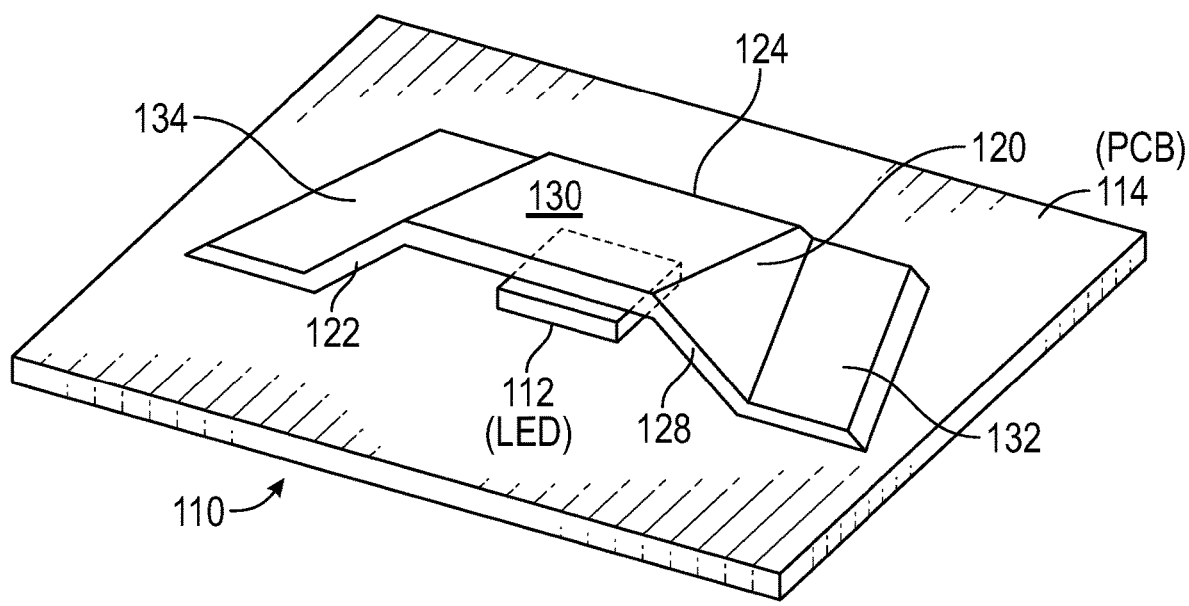
FIG. 3 is a perspective view of a second embodiment of a disclosed simulated edge-emitting assembly employing a surface-emitting diode.

Shown in FIG. 3 is a second embodiment of an edge-emitting radiation emitting diode assembly 110. Assembly 110 includes a radiation emitting diode 112 solder-mounted to a circuit substrate 114, and a surface mountable reflector 116 affixed to substrate 114.

Reflector 116 has opposite side walls 120, 122 that diverge from a generally closed end 124 toward an open end 128, and a roof 130. Walls 120, 122 and roof 130 diverge from end 124 toward end 128 to redirect (reflect) light impinging on internal surfaces of walls 120, 122 and roof 130 outward from open end 128. Mounting pads 132, 134 can be provided to facilitate attachment of reflector 116 to circuit substrate 114. Except for the slight difference in the shape of reflectors 16 and 116, assemblies 10 and 110 are otherwise similar and provide similar performance and functionality.

Figure 4:
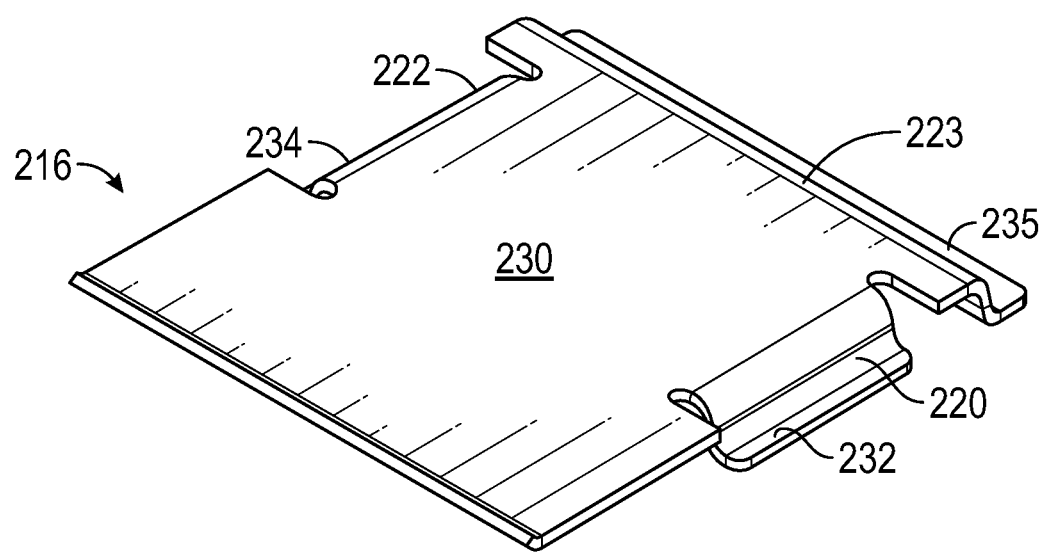
FIG. 4 is a perspective view of a third embodiment of a surface mountable reflector for a simulated edge-emitting assembly employing a surface-emitting diode.
Figure 5:
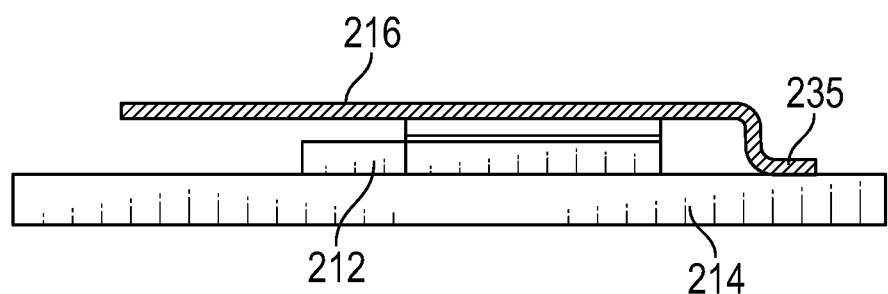
FIG. 5 is a side view of the third embodiment.

Shown in FIGS. 4 and 5 is a third embodiment of a surface mount reflector 216 for a simulated edge emitting diode assembly 210. The assembly includes a radiation emitting diode 212 solder-mounted to a circuit substrate 214 and a surface mountable reflector 216 affixed to the circuit substrate.

Surface mountable reflector 216 includes opposite side walls 220, 222, rear wall 223 and a generally rectangularly shaped roof 230 from which walls 220, 222 and 223 depend. Each of walls 220, 222 and 223 have an associated mounting pad 232, 234 and 235, respectively to facilitate attachment of the surface mountable reflector 216 to substrate 214.

Figure 6:
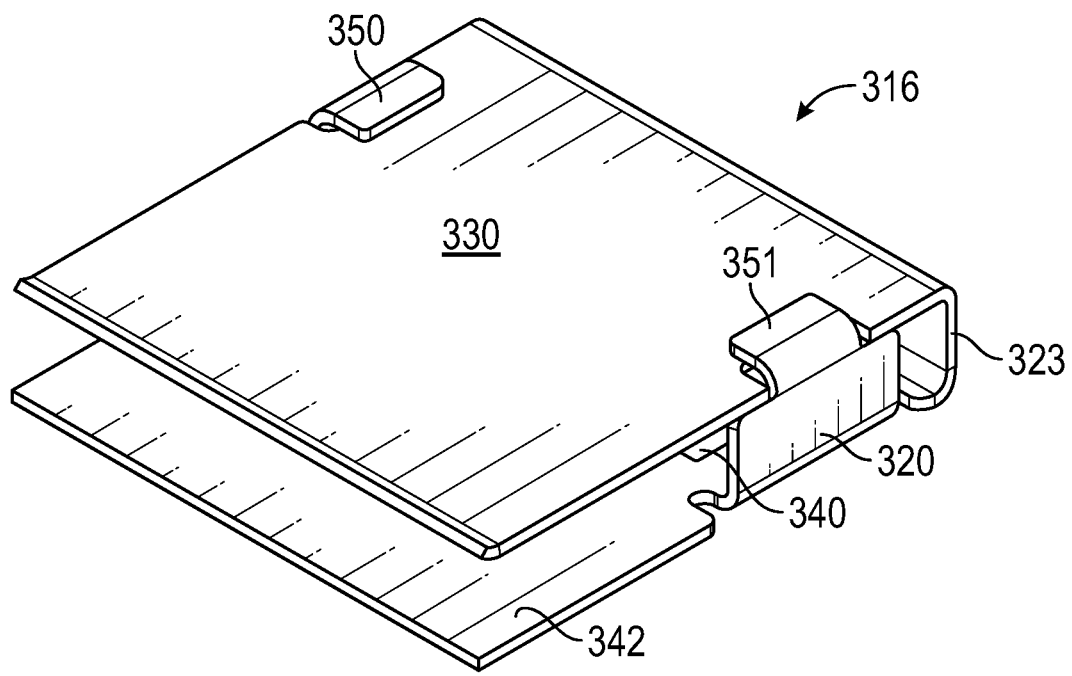
FIG. 6 is a perspective view of a fourth embodiment of a surface mountable reflector for an edge-emitting assembly employing a surface-emitting diode.
Figure 7:
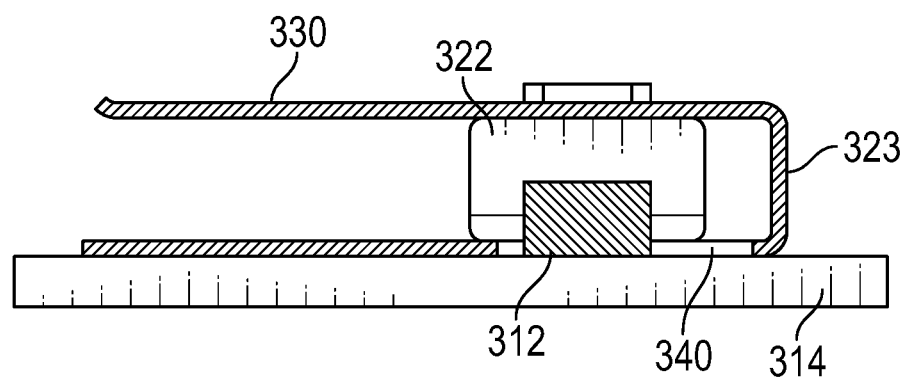
FIG. 7 is a side view of the fourth embodiment.

Shown in FIGS. 6 and 7 is another embodiment of a surface mountable reflector 316 mounted on a circuit substrate on which a radiation-emitting diode 312 is also mounted at an opening 340 in a base 342 of surface mountable reflector 316. A reflective roof 330 is supported by side walls 320, 322 that extend upwardly from base 342 and have upper surfaces that support edges of roof 330. A rear wall 323 extends upwardly from base 342 and also supports roof 330. Tabs 350 and 351 extend from an upper edge of walls 320, 333, respectively and are bent over roof 330 such that the opposite edges of roof 330 are securely pressed between the upper edges of walls 320, 322 and tabs 351, 350, respectively. Roof 330 and walls 320, 322 and 323 are preferably reflective, and can be polished or coated to provide highly reflective surfaces to direct radiation from diode 312 toward an open end of surface mountable reflector 316 opposite of rear wall 323. In this embodiment, base 342 or any portion thereof serves as a mounting pad.

The internal (reflective) surfaces of reflectors 16, 116, 216 and 316 (i.e., the surfaces upon which radiation emitted from diodes 12, 112, 212, 312 respectively, impinge) can be polished and/or provided with a reflective metal coating when enhanced reflectively is desired. Techniques that can be employed include electroplating, electroless plating, vapor deposition, and sputter deposition. Plating materials can be selected from gold, silver, copper, rhodium, chrome, zinc, zinc-nickel, tin, nickel, and other metals.

Surface mountable reflectors 16, 116, 216, 316 can be fabricated from thermoplastic materials using injection molding techniques. However, reflectors 16, 116, 216, 316 can be more economically produced when fabricated from sheet metal materials using metal stamping techniques (such as cutting, piercing and bending). Suitable sheet metal materials include stainless steel, brass, tin, and copper. However, generally any metal sheet material that can be cut and bent into the desired structure will suffice.

The circuit substrates referred to herein encompass any printed circuit board or printed wiring board comprising at least one electrically conductive layer and at least one insulating layer, on which electronic components can be solder mounted, and that include a pattern of electrical conductors for providing appropriate connections among the electronic components. Circuit substrates may also include isolated areas or islands of conductive material on which the surface mountable reflectors 16, 116, 216, 316 can be solder mounted.

The various surface mountable reflectors disclosed herein may be used with generally any type of radiation emitting diodes, including visible light emitting diodes (LEDs), infrared emitting diodes (sometimes referred to as IR-LEDs), and ultraviolet radiation emitting diodes (sometimes referred to as UV-LEDs). The radiation emitting diodes referred to herein include conventional radiation emitting diode packages having one or more radiation emitting diode chips supported on a lead frame and encapsulated or contained in a transparent housing, as well as chip scape packages (CSPs) that typically consist of a die on which a phosphor layer is coated and with the underside of the die being metallized with electrical contacts.

While the radiation emitting diode and the surface mountable reflector can be conveniently soldered to the circuit substrate in a single operation, the surface mountable reflector can, as an alternative, be affixed to the circuit substrate using another technique such as adhesive bonding.

The assemblies 10, 110, 210, 310 have an advantage over assemblies employing side-emitting diodes in certain applications that is attributable to the reduced thickness of top-emitting diodes as compared with side-emitting diodes. In particular, because chip scale package top-emitting diodes are approximately 0.3 mm tall (thick), it is possible to employ a reflector 16, 116, 216, 316 that is only about 1 mm to 2 mm tall (thick), as compared to a typical side-emitting diode package having a height (thickness) of about 5 mm. The resulting assemblies 10, 110, 210, 310 are more compact and lighter in weight, providing highly desired attributes, including the higher output available from top-emitting packages. Additionally, mounting and installation of top-emitting diodes is simpler and more conducive to high-speed production techniques using pick-and-place positioning on the circuit substrate and solder reflow mounting.

While the present invention is described herein with reference to illustrated embodiments, it should be understood that the invention is not limited hereto. Those having ordinary skill in the art and access to the teachings herein will recognize additional modifications and embodiments within the scope thereof. Therefore, the present invention is limited only by the claims attached herein.

The invention claimed is:

1. A simulated edge-emitting diode assembly, comprising:
   a circuit substrate;
   a surface-emitting diode mounted on the circuit substrate;
   a surface mountable reflector affixed to the circuit substrate, the surface mountable reflector having opposite reflective side walls that diverge from a generally closed end toward an open end and a reflective roof that diverges from the closed end toward the open end, wherein the surface-emitting diode is located between the circuit substrate and the roof of the surface mountable reflector; and
   a solder joint affixing the surface mountable reflector to the circuit substrate,
   wherein the surface mountable reflector is fabricated of a metal sheet that has been cut and bent.

2. The assembly of claim 1, in which one or more of the reflective surfaces facing the diode is provided with a metal plating to enhance reflectivity.

3. The assembly of claim 1, in which the surface mountable reflector includes a mounting pad extending laterally outward from a bottom edge of each reflective side wall.

4. The assembly of claim 1, wherein the surface-emitting diode is in a chip scale package.

5. The assembly of claim 1, wherein the surface-emitting diode is an LED.

6. The assembly of claim 1, wherein the surface-emitting diode is an infrared-emitting diode.

7. The assembly of claim 1, wherein the surface-emitting diode is an ultraviolet-emitting diode.

8. The assembly of claim 1, wherein the opposite reflective side walls and the reflective roof are relatively smooth and generally flat.

9. A surface mountable reflector configured to be disposed over a surface-emitting diode mounted on a circuit substrate, comprising:
   a unitary body having opposite reflective side walls that diverge from a generally closed end toward an open end, a reflective roof that diverges from the closed end toward the open end, and a mounting pad extending laterally outward from a bottom edge of at least one of the reflective side walls,
   wherein the mounting pad is configured to be soldered to the circuit substrate, and
   wherein the surface mountable reflector is fabricated of a metal sheet that has been cut and bent.

10. The surface mountable reflector of claim 9 wherein one or more interior surfaces of the reflector is provided with a metal plating to enhance reflectivity.

11. The surface mountable reflector of claim 9, wherein the opposite reflective side walls and the reflective roof are relatively smooth and generally flat.

12. A simulated edge-emitting diode assembly, comprising:
   a circuit substrate;
   a surface-emitting diode mounted on the circuit substrate; and
   a surface mountable reflector affixed to the circuit substrate with a solder joint, the reflector having a reflective roof that diverges from a closed end toward an open end, and wherein the surface-emitting diode is positioned between the circuit substrate and the reflective roof,
   wherein the surface mountable reflector is fabricated of a metal sheet that has been cut and bent.

* * * * *